United States Patent
Shelnut et al.

(10) Patent No.: US 7,251,405 B2
(45) Date of Patent: Jul. 31, 2007

(54) OPTICAL DRY-FILMS AND METHODS OF FORMING OPTICAL DEVICES WITH DRY FILMS

(75) Inventors: James G. Shelnut, Lancaster, MA (US); Matthew L. Moynihan, Sterling, MA (US); Luke W. Little, Brighton, MA (US)

(73) Assignee: Rohm and Haas Electronic Materials LLC, Marlborough, MA (US)

( * ) Notice: Subject to any disclaimer, the term of this patent is extended or adjusted under 35 U.S.C. 154(b) by 50 days.

(21) Appl. No.: 11/316,465

(22) Filed: Dec. 22, 2005

(65) Prior Publication Data

US 2006/0133766 A1 Jun. 22, 2006

Related U.S. Application Data

(60) Provisional application No. 60/638,458, filed on Dec. 22, 2004, provisional application No. 60/667,132, filed on Mar. 31, 2005.

(51) Int. Cl.
*G02B 6/00* (2006.01)
(52) U.S. Cl. .................. 385/129; 385/130; 385/147
(58) Field of Classification Search ........ 385/129–132, 385/147
See application file for complete search history.

(56) References Cited

U.S. PATENT DOCUMENTS

| | | | |
|---|---|---|---|
| 5,292,620 | A | 3/1994 | Booth et al. |
| 5,402,514 | A | 3/1995 | Booth et al. |
| 5,540,799 | A | 7/1996 | Lebby et al. |
| 5,858,051 | A | 1/1999 | Komiyama et al. |
| 6,440,642 | B1 | 8/2002 | Shelnut et al. |
| 6,511,615 | B1 | 1/2003 | Dawes et al. |
| 6,731,857 | B2 | 5/2004 | Shelnut et al. |
| 7,072,564 | B2 * | 7/2006 | Shelnut et al. ............. 385/143 |
| 2002/0135991 | A1 | 9/2002 | Doi |
| 2003/0091926 | A1 | 5/2003 | Shelnut |
| 2003/0099899 | A1 | 5/2003 | Gronbeck et al. |
| 2003/0209515 | A1 | 11/2003 | Pavelchek |
| 2004/0022499 | A1 | 2/2004 | Shimizu et al. |
| 2004/0047580 | A1 | 3/2004 | Shimada et al. |

(Continued)

FOREIGN PATENT DOCUMENTS

EP 1 426 793 6/2004

(Continued)

OTHER PUBLICATIONS

European Search Report of corresponding European application No. 05 25 7941 dated Mar. 23, 2006.

(Continued)

*Primary Examiner*—Kevin S Wood
(74) *Attorney, Agent, or Firm*—Jonathan D. Baskin

(57) ABSTRACT

Provided is a dry-film suitable for use in forming an optical component. The dry-film includes a carrier substrate having a front surface and a back surface. A non-photoimageable, thermally curable polymeric layer is provided over the front surface of the carrier substrate. The polymeric layer includes a thermally active component and units of the formula $(RSiO_{1.5})$, wherein R is a substituted or unsubstituted organic group. A protective cover layer is disposed over the front or back surface of the carrier substrate. Also provided are methods of forming optical devices with dry-films. The invention finds particular applicability in the optoelectronics industry.

11 Claims, 2 Drawing Sheets

U.S. PATENT DOCUMENTS

| | | |
|---|---|---|
| 2004/0063026 A1 | 4/2004 | Barr et al. |
| 2004/0253535 A1 | 12/2004 | Cameron et al. |
| 2004/0265754 A1 | 12/2004 | Barclay et al. |
| 2006/0098926 A1 | 5/2006 | Shelnut et al. |
| 2006/0133755 A1 | 6/2006 | Shelnut et al. |
| 2006/0133756 A1 | 6/2006 | Shelnut et al. |

FOREIGN PATENT DOCUMENTS

| | | |
|---|---|---|
| EP | 1 251 155 | 1/2006 |
| JP | 1994-258537 | 9/1994 |
| JP | 2003-195080 | 7/2003 |
| JP | 2003-195081 | 7/2003 |
| JP | 2003-202437 | 7/2003 |
| WO | WO 03/005616 | 1/2003 |
| WO | WO 2004/037866 | 5/2004 |

OTHER PUBLICATIONS

Bhattacharya et al., "Integral passives for next generation of electronic packaging: application of epoxy/ceramic nanocomposites as integral capacitors", Microelectronics Journal, vol. 32, No. 1, Jan. 2001, pp. 11-19.

Booth et al., "Low Loss Channel Waveguides in Polymers", Journal of Lightwave Technology, IEEE Service Center, New York, vol. 7, No. 10, Oct. 1989, pp. 1445-1453.

Booth et al., "Polyguide Polymeric Technology for Optical Interconnect Circuits and Components", www.opticalcrosslinks.com/pdf/photonics97.pdf, Photonics West, Conf. Proceedings, San Jose, CA, Feb. 12-14, 1997, vol. 3005, pp. 238-251.

J.T. Gallo et al., "High-Density Interconnects for 2-Dimensional VCSEL Arrays Suitable for Mass Scale Production", www.opticalcrosslinks.com/pdf/HighDensityInterconnects8.pdf, ITCom 2001, Paper 4532-47, 2001.

B. Booth, "Polymers for Integrated Optical Waveguides", *Polymers for Electronic and Photonic Applications*, C.P. Wang Ed., pp. 549-599, 1993, Academic Press.

Weber et al., "Light-Guiding Structures of Photoresist Films", Appl. Phys. Lett., vol. 20, No. 3, Feb. 1972, pp. 143-145.

Optical Crosslinks, "Polymer Technology Overview", www.opticalcrosslinks.com/pdf/WebPolymerTechnologyPlatform.pdf, 2001.

\* cited by examiner

FIG. 1B  FIG. 1C

OPTICAL DRY-FILMS AND METHODS OF FORMING OPTICAL DEVICES WITH DRY FILMS

CROSS-REFERENCE TO RELATED APPLICATIONS

This application claims the benefit of priority under 35 U.S.C. §119(e) to U.S. Provisional Application Nos. 60/638,458, filed Dec. 22, 2004, and 60/667,132, filed Mar. 31, 2005, the entire contents of which applications are incorporated herein by reference.

BACKGROUND OF THE INVENTION

The present invention relates generally to the field of optoelectronics. In particular, the present invention relates to dry-films which are suitable for use in forming optical components such as waveguides. As well, the invention relates to methods of forming optical components with a dry-film. The invention additionally relates to methods of forming electronic devices such as printed wiring boards having optical functionality.

Signal transmission using pulse sequences of light is becoming increasingly important in high-speed communications and data transfer. For example, optical integrated circuits are gaining importance for high bandwidth optical interconnects. As a result, the integration of optical components such as waveguides, filters, optical interconnects, lenses, diffraction gratings, and the like, is becoming increasingly important.

The incorporation of optical layers in the form of embedded optical waveguides into printed wiring boards is known. For example, U.S. Pat. Nos. 6,731,857 and 6,842,577 to Shelnut et al, disclose embedded optical waveguides formed using silsesquioxane chemistry on a printed wiring board substrate. The optical waveguides include a core and a clad surrounding the core, with optical radiation propagating in the core due to its higher index of refraction as compared to the clad.

Embedded optical waveguides are typically formed by coating a bottom clad layer over a substrate, coating a core layer over the bottom clad layer, patterning the core layer to form a core structure, and forming a top clad layer over the bottom clad layer and core structure. The bottom clad, core and top clad layers may be formed from compositions in liquid form which include solvent and polymer components. Where the waveguides are to be formed as part of a printed wiring board, use by the board manufacturer of a specialized coating tool such as a roller coater, curtain coater, slot coater or spin-coater is typically required. Once the liquid composition is coated, the solvent is removed from the coating by a drying process. The solvents used in the liquid compositions may be flammable and/or explosive in nature, and may additionally be deemed environmental pollutants. As a result, board manufacturers must take measures to contain or treat the solvent and maintain its vapor concentration at safe levels. Such measures include, for example, solvent collection, incineration with or without catalytic converters and use of explosion-proof equipment. The costs associated with these activities can be significant. It would thus be desired for component manufacturers to have at their disposal an optical material which is in an easily-applicable form and is solvent-free or extremely low in solvent-content.

Formation of optical waveguides on a printed wiring board using a series of pre-cast, or dry-film, layers has been proposed. For example, International Publication No. WO 03/005616 discloses methods of forming multi-level printed wiring boards that integrate optical data communications with other boards without electrical connections. Optical waveguides are formed on the printed wiring board by laminating the entire top surface of the printed wiring board with a first polymeric optical conductive layer, a second, higher refractive index polymeric layer, and a third layer of the first layer polymer material. As understood, the disclosed polymeric material is acrylate-based. There are, however, various drawbacks associated with the use of acrylates in forming optical components. For example, acrylates are generally not suitable for use in high temperature applications, for example, in chip-to-chip applications. At temperatures approaching 200° C., most acrylate materials begin to decompose and depolymerize. Moreover, acrylates are structurally and optically dissimilar to glass, which is the current material of choice for optical fibers and pigtail structures.

The aforementioned U.S. Pat. No. 6,731,857 discloses silicon-based photoimageable waveguide compositions which can be coated as a dry-film. These photoimageable compositions include silsesquioxane units of the formula $(RSiO_{1.5})$, wherein R is a side chain group selected from hydroxyphenyl and hydroxybenzyl. Photoimageable compositions lend themselves to the formation of patterned waveguide core structures. Patterning of the core structures involves exposing a layer of the photoimageable composition with actinic radiation through a photomask, followed by development of the exposed layer and thermal curing. The capital cost and labor associated with the use of exposure equipment, however, can be significant. It would therefore be desirable to use a lower cost alternative and one having fewer process steps in forming a waveguide clad layer using a silsesquioxane-containing polymeric dry-film.

There is thus a need in the art for optical dry-films and for methods of forming optical components which overcome or conspicuously ameliorate one or more of the foregoing problems associated with the state of the art.

SUMMARY OF THE INVENTION

A first aspect of the invention provides dry-films suitable for use in forming optical components. The dry-films include a carrier substrate having a front surface and a back surface. A non-photoimageable, thermally curable polymeric layer is disposed over the front surface of the carrier substrate. The polymeric layer includes a thermally active component and units of the formula $(RSiO_{1.5})$, wherein R is a substituted or unsubstituted organic group. A protective cover layer is disposed over the front or back surface of the carrier substrate.

In a second aspect of the invention, methods of forming an optical device are provided. The methods involve applying over a first substrate a dry-film. The dry-film includes a carrier substrate and a non-photoimageable, thermally curable polymeric layer. The polymeric layer includes a thermally active component and units of the formula $(RSiO_{1.5})$, wherein R is a substituted or unsubstituted organic group. Then, at least a portion of the polymeric layer is heat-cured.

In a third aspect of the invention, optical components such as optical waveguides may be formed using the described dry-films and methods. The dry-films are particularly suited for forming a waveguide clad.

In a fourth aspect of the invention, the dry-films and methods of the invention may be used to form an electronic component such as a printed wiring board that includes optical functionality, for example, in the form of embedded optical waveguides.

As used herein, the terms "polymer" includes oligomers, dimers, trimers, tetramers and the like, and encompasses homopolymers and higher order polymers, i.e., polymers formed from two or more different monomer units and heteropolymers. The terms "a" and "an" are inclusive of "one or more". The term "on" and "over" are used interchangeably in defining spatial relationships, and encompass the presence or absence of intervening layers or structures. Unless otherwise specified, amounts for components of the compositions are given in weight % based on the composition absent any solvent. Also as used herein to describe the polymeric layer, "non-photoimageable, thermally curable" means that substantial cross-linking of the polymeric layer can be effected by thermal effects and not by photochemical effects.

BRIEF DESCRIPTION OF THE DRAWINGS

The present invention will be discussed with reference to the following drawings, in which like reference numerals denote like features, and in which:

FIGS. 1A-C illustrate exemplary optical dry-films in accordance with the invention.

DETAILED DESCRIPTION OF THE INVENTION

Figure 1A:
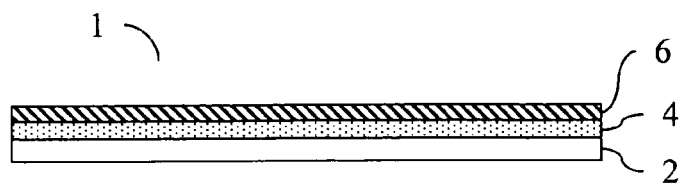

The present invention will now be described with reference to FIG. 1, which illustrates in cross-section an exemplary dry-film 1 in accordance with the present invention. The inventive dry-films are suitable for use in forming optical components, such as optical waveguides, filters, optical interconnects, lenses, diffraction gratings, and the like. The illustrated dry-film 1 includes a carrier substrate 2, a non-photoimageable, thermally curable polymeric layer 4 over the front surface of the carrier substrate, and a protective cover layer 6. The protective cover layer 6 may, for example, be disposed on the front surface of the dry-film over the polymeric layer 6 as shown in FIG. 1A or on the back surface of the dry-film as illustrated in FIG. 1B. Use of a back surface protective cover layer may be desired, for example, where multiple dry-film sheets are arranged in a stacked arrangement or if the dry-film is stored in roll-form 8 such as shown in FIG. 1C.

The carrier substrate 2 typically functions as a mechanical support for the polymeric layer 4 and any other layers of the dry-film during manufacture, storage and subsequent processing. The carrier substrate 2 may be removed from the remainder of the dry-film in subsequent use, or may form part of the final structure of the device fabricated. Where the carrier substrate is eventually removed from the dry-film such as by peeling, adhesion between the carrier substrate and the remainder of the dry-film is typically low to moderate to allow for ease in separation. In cases in which the carrier substrate is to form part of the final device, adhesion is typically high to prevent peeling of the carrier substrate. The particular material used for the carrier substrate may vary widely. The material may be natural or synthetic and may be capable of existing in a flexible or rigid film/sheet form. Suitable carrier substrate materials include, for example: polyethylene terephthalate (PET), typically an optically pure PET, which may be treated in various ways, for example, resin-coated, flame or electrostatic discharge-treated, or slip-treated; a paper such as polyvinyl alcohol-coated paper, crosslinked polyester-coated paper, polyethylene-coated paper, cellulose paper, or a heavy paper such as lithographic paper; nylon; glass; cellulose acetate; a synthetic organic resin; a polyolefin such as polypropylene; a polyimide; a polyurethane; a polyacrylate such as polymethylmethacrylate (PMMA); fiberboard; a metal such as copper, aluminum, tin, magnesium, zinc, nickel, or an alloy thereof; and a multilayered structure of two or more of these or other materials, for example, a copper-coated fiberboard or epoxy laminate. The carrier substrate typically has a thickness, for example, of from about 25 to 250 µm.

The polymeric layer 4 is of a material making it suitable for use in forming an optical component. For example, in the case of an optical waveguide, the polymeric layer has particular applicability in forming the waveguide clad. The polymeric layer is formed from a composition that includes silsesquioxane units of the formula $(RSiO_{1.5})$, wherein R is a substituted or unsubstituted organic group. The composition further includes a thermally active component, such s a thermal acid or thermal base generator, and other optional components. Further details of compositions useful in forming the polymeric layer 4 are provided below. The thickness of the polymeric layer 4 is typically from about 5 to 150 µm.

The protective cover layer 6 provides protection to the polymeric layer 4, and is typically in the form of a removable film or sheet that may be peeled from the remainder of the dry-film. In the exemplified dry-film of FIG. 1A, adhesion of the protective cover layer 6 to the polymeric layer 4 is less than that of the carrier substrate 2 to the polymeric layer. This allows for separation of the protective cover layer from the polymeric layer without also separating the polymeric layer from the carrier substrate. Suitable materials for the protective cover layer include, for example, polyolefins such as polyethylene and polypropylene, polyvinyl alcohol, and PET. The protective cover layer 6 typically has a thickness of from about 10 to 100 µm. Optionally, the protective cover layer may include a first layer coated with a release layer which contacts the polymeric layer. Suitable release layer materials include, for example, thermally or photochemically cured silicones, polyvinyl stearate, polyvinyl carbamates, poly N-ethyl-perfluoroactyl sulfanamidoethyl methacrylate, poly(tetrafluorothylene), polypropylene, polymethyl methacrylate, polysiloxanes, polyamides, and other release materials such as those described in Satas, *Handbook of Pressure Sensitive Adhesive Technology*, 2$^{nd}$ ed., Van Nostrand/Reinhold (1989). As described above, the protective cover layer 6 may be formed on the back surface of the carrier substrate 2 as shown in the exemplary dry-film of FIG. 1B. The same materials described above with respect to the protective cover layer and release layer may be used for this purpose. The protective cover layer may itself be in the form of a release layer such as described above, formed on the back surface of the carrier substrate. U.S. Pat. No. 6,057,079 to Shelnut, the contents of which are incorporated herein by reference, describes suitable back surface release coatings which may be used in the optical dry-films of the present invention. The protective cover layer may further be formed by surface treating the back surface of the carrier substrate to produce release characteristics with respect to the polymeric layer, for example, by altering the surface states of the carrier substrate back surface.

The dry-films in accordance with the invention may be prepared, for example, by coating the composition for the polymeric layer onto a carrier substrate, for example, by meniscus coating, spray coating, roller coating, wire roll coating, doctor blade coating, curtain coating and the like, typically to a dry thickness of from 5 to 150 microns. The coated carrier substrate may be dried, for example, by convection drying, infrared drying, air drying and the like, typically to a solvent content of from 0 to 10 wt %, typically less than 5 wt % or from 2 to 5 wt %, based on the polymeric layer.

The carrier substrate may be in the form of discrete sheets, typically from 2 to 150 cm in width and from 2 to 150 cm in length, which may be coated and dried as sheets and stacked. The carrier sheet may further be in the form of a roll, typically from 2 to 150 cm in width and from 0.5 to 1000 meters in length, which may be coated and dried in a reel-to-reel format, commonly known as a web coating process. The protective cover layer may be applied, for example, by lamination with or without heat and/or pressure. The sheets may be stacked or the web rolled with a front surface or back surface protective cover layer to separate the sheets or wraps.

The invention further provides methods of forming an optical device using a dry-film as described above. Briefly stated, the methods involve applying over a first substrate a dry-film that includes a polymeric layer on a carrier substrate such as described above, and heat-curing at least a portion of the, and typically the entire, polymeric layer.

FIGS. 2A-F illustrates an optical waveguide structure on a printed wiring board at various stages of formation thereof. While the invention is described with reference to this exemplary embodiment, it should be clear that optical components other than waveguides may be formed, such as filters, optical interconnects, lenses, and diffraction gratings. Similarly, electronic substrates other than printed wiring board substrates, such as semiconductor wafers, and non-electronic substrates may be employed.

Figure 2A:
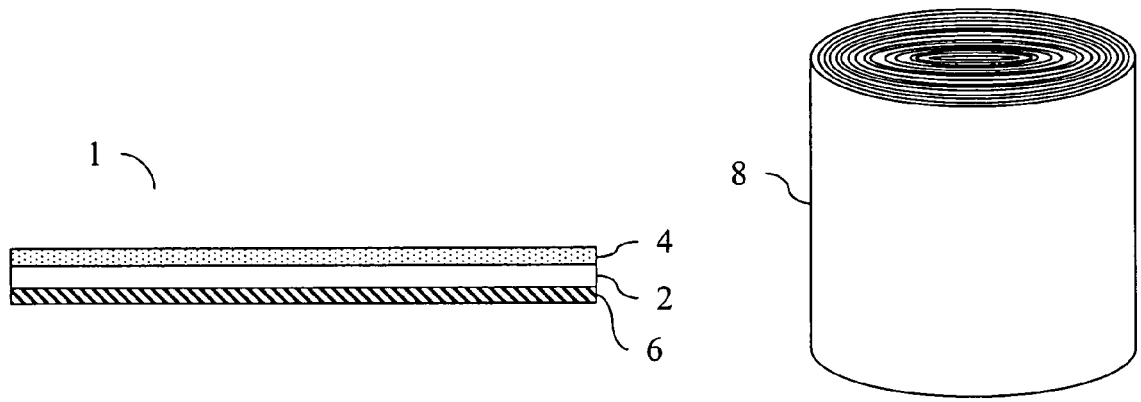
FIGS. 2A-F illustrate an exemplary printed wiring board having optical functionality at various stages of formation thereof in accordance with the invention.
Figure 2A:
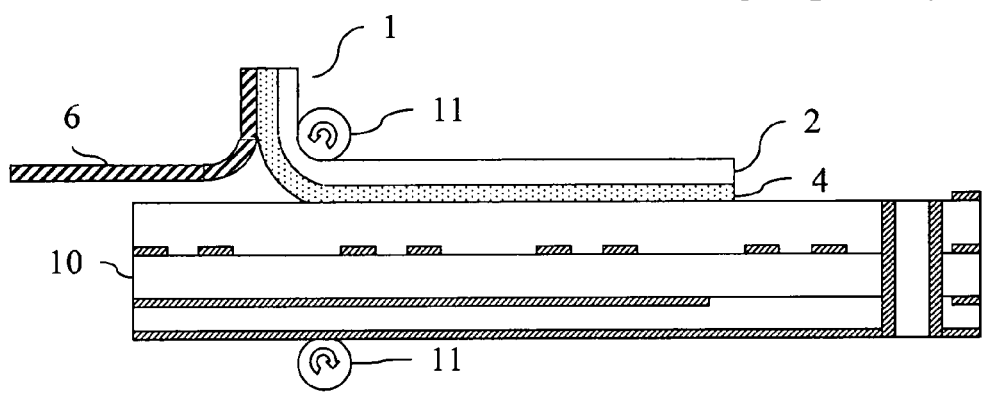

As shown in FIG. 2A, a printed wiring board substrate 10 is provided. The printed wiring board substrate may be, for example, a laminated sheet that includes a series of epoxy resin and copper layers on which etched electronic circuits, conductive traces and electronic components are formed or will be formed on one or both sides. Depending on the board's design, the optical waveguide structure may be incorporated into the board at an earlier or later stage in the board fabrication process.

The dry-film 1 described above is affixed to the printed wiring board substrate 10 to form an optical waveguide bottom clad layer. Suitable techniques for affixing the dry-film to the substrate 10 include, for example, lamination techniques such as hot roll lamination. In the exemplified method, the dry-film 1 is placed into a hot roll laminator, the protective cover layer 6 is peeled away from the polymeric layer 4, and the polymeric layer 4 is brought into contact with and laminated to the printed wiring board substrate 10 using rollers 11 with heat and pressure. The lamination temperature is typically from about 21 to 150° C., for example, from about 25 to 110° C. The pressure is typically from about 0.1 to 5 kg/cm² (1.4 to 71 psi), for example, from about 0.3 to 2 kg/cm² (4.3 to 28.5 psi). The speed of the rollers 11 is typically from about 1.5 to 600 cm/min, for example, from about 30 to 150 cm/min. The polymeric layer 4 is next cured by a thermal treatment. Typical curing temperatures are from about 120 to 200° C., for example, from about 145 to 180° C., and curing time is typically from about 0.5 to 5 hours, for example, from about 1 to 3 hours. The atmosphere used in the thermal treatment is not limited, and is typically air or an inert gas. The curing may be conducted, for example, in an oven such as a convection over or on a hot plate. The carrier substrate 2 is typically removed from the polymeric layer 4 and printed wiring board substrate 10, such as by peeling, before the thermal treatment.

Figure 2B:
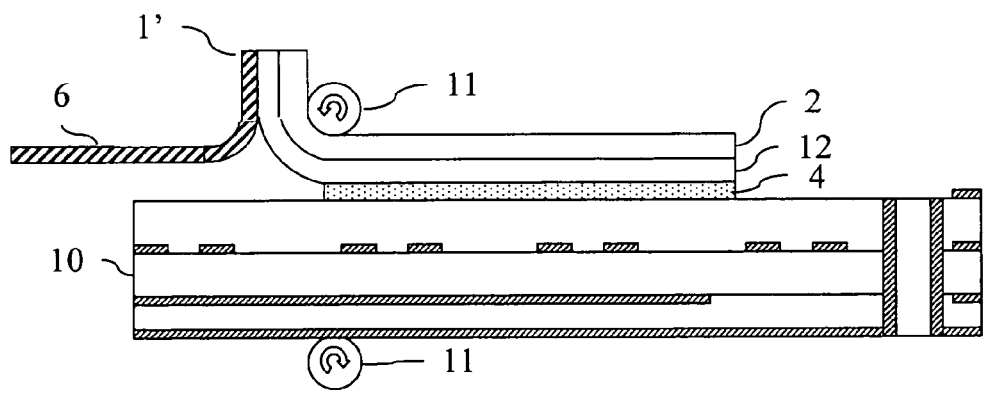

A waveguide core structure is next formed over the bottom clad layer. The waveguide core may be formed with a photoimageable material, such as disclosed in U.S. Pat. Nos. 6,731,857 and 6,842,577, the contents of which are incorporated by reference. FIG. 2B illustrates a photoimageable dry-film 1' which may be used to form the waveguide core structure. The core dry-film 1' may be affixed to the bottom clad layer 4 in the manner described above with reference to the bottom clad dry-film 1. The core dry-film 1' may have the same or similar construction as the bottom clad dry-film 1 except for the core polymeric layer's photoimageablity and its providing a refractive index in the final waveguide structure that is greater than that of the cladding.

Figure 2C:
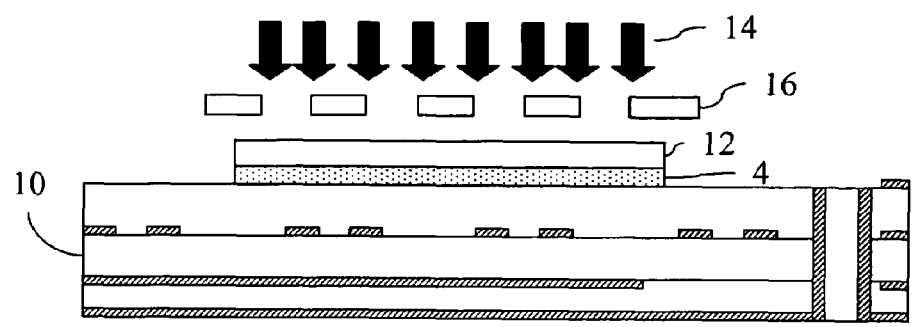
Figure 2D:
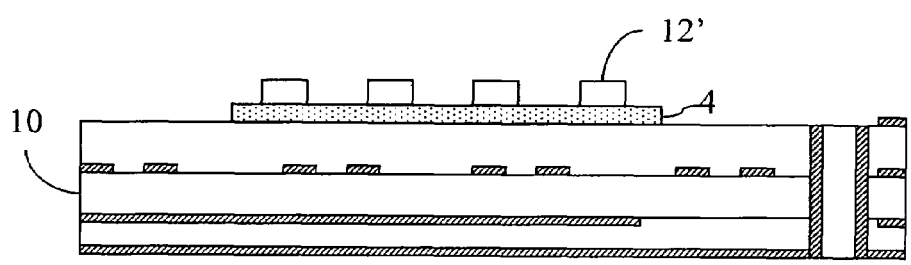

The second polymeric layer 12 is next patterned as illustrated in FIGS. 2C and D. As illustrated, the photoimageable core layer 12 may be imaged by exposure to actinic radiation 14 through a photomask 16, as illustrated in FIG. 2C. In the case of a negative-acting material, polymerization in the exposed regions of the core layer 12 decreases the solubility thereof in a developer solution. As shown in FIG. 2D, the unexposed portions of core layer 12 are removed by the developer solution, leaving one or more core structures 12'.

Figure 2E:
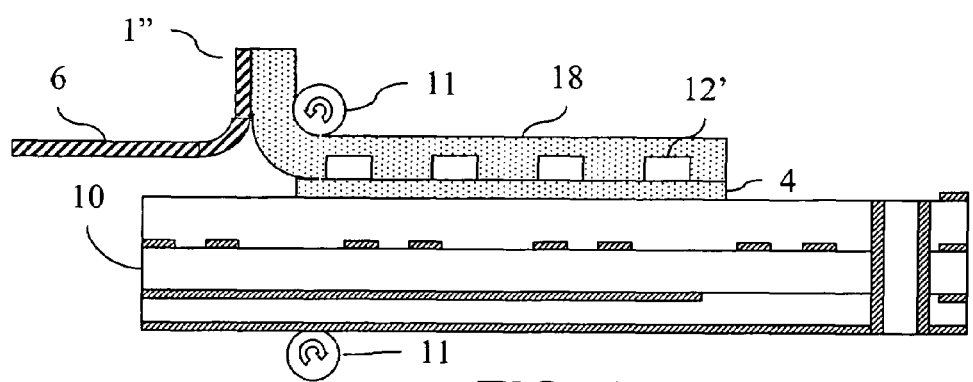
Figure 2F:
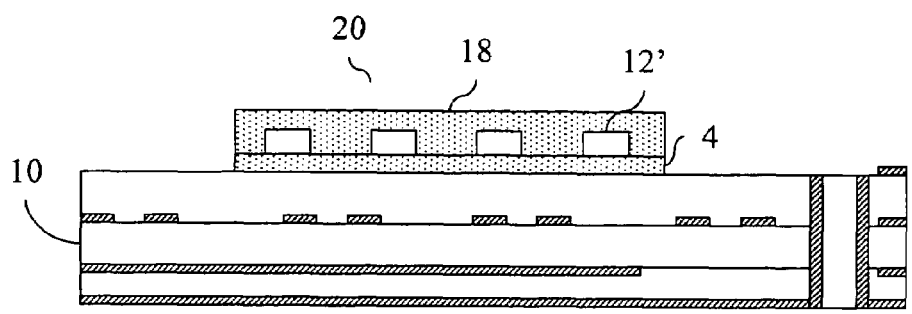

Following formation of core structures 12', a top clad layer 18 is formed over the bottom clad layer 4 and core structures 12' by application of another dry-film 1", as shown in FIG. 2E. The same materials and procedures employed in processing the bottom clad polymeric layer 4 may be used for the top clad polymeric layer 18. The refractive index of the top clad polymeric layer 18 in the final waveguide structure is less than that of the core structures 12' and is typically the same as the bottom clad layer 4. A waveguide structure 20 including bottom clad layer 4, core structure 12' and top clad layer 18 is thereby formed, as shown in FIG. 2F.

Following formation of the optical waveguide structure on the printed wiring board substrate 10, the printed wiring board may be further processed. For example, one or more dielectric and/or metal layers may be formed over the waveguide structure, to form a metallization structure for signal routing. Similarly, one or more additional optical layers may be provided, for example, to form additional optical waveguide structures, optical vias or other optical components. Electrically connecting an optoelectronic device such as a photodetector or a laser emitting device, for example, a VCSEL chip, may also be performed at this stage. The printed wiring board is processed to completion using known techniques such as those described in Coombs, *Printed Circuit Handbook*, 5$^{th}$ ed., McGraw-Hill (2001).

As described above, the dry-film polymeric layer is formed from a composition that includes silsesquioxane units of the formula ($RSiO_{1.5}$), wherein R is a substituted or unsubstituted organic group. The polymer may be present in the composition in an amount of from 1 to 99.5 wt %, for example from 60 to 98.5 wt %. Exemplary organic groups for R include substituted and unsubstituted aliphatic, aromatic and heterocyclic groups. The aliphatic groups may be straight-chain, branched-chain or cyclic, saturated or unsaturated. Suitable aliphatic groups include, for example, those having from 1 to 20 carbon atoms, such as methyl, ethyl, propyl, isopropyl, t-butyl, t-amyl, octyl, decyl, dodecyl, cetyl, stearyl, cyclopentyl, cyclohexyl, 2-ethylhexyl, ($C_2$-

$C_6$)alkenyl, norbonyl and adamantyl. The aliphatic group may be substituted, for example, wherein one or more hydrogen atom on the side chain group is replaced by a heteroatom or other group, for example, deuterium, hydroxy, halogen such as fluorine, bromine, or chlorine, ($C_1$-$C_6$)alkyl, ($C_1$-$C_6$)haloalkyl, ($C_1$-$C_{10}$)alkoxy, ($C_1$-$C_{10}$)alkylcarbonyl, ($C_1$-$C_{10}$)alkoxycarbonyl, ($C_1$-$C_{10}$)alkylcarbonyloxy, alkylamine, alkylsulfur-containing materials, and the like. Additionally or alternatively, one or more carbon atom in the aliphatic chain may be substituted with a heteroatom such as nitrogen, oxygen, sulfur, phosphorus, and arsenic. Such heteroatom-substituted aliphatic groups include, for example, piperidinyl and tetrahydrofuranyl.

Aromatic groups which may be used include, for example, those having from 6 to 20 carbon atoms such as phenyl, biphenyl, tolyl, 1-naphthyl, 2-naphthyl and 2-phenanthryl. For purposes herein, a side-chain group that includes an aromatic constituent is considered an aromatic group. Thus, groups containing both aryl and alkyl components such as benzyl, phenethyl, methylbenzyl and ethylbenzyl are aromatic groups. The aromatic group may be substituted, for example, wherein one or more hydrogen atom on the side chain group is replaced by a heteroatom or other group, for example, deuterium, hydroxy, halogen such as fluorine, bromine, or chlorine, ($C_1$-$C_6$)alkyl, ($C_1$-$C_6$)haloalkyl, ($C_1$-$C_{10}$)alkoxy, ($C_1$-$C_{10}$)alkylcarbonyl, ($C_1$-$C_{10}$)alkoxycarbonyl, ($C_1$-$C_{10}$)alkylcarbonyloxy, alkylamine, alkylsulfur-containing materials, and the like. Additionally or alternatively, one or more carbon atom in the aryl group may be substituted with a heteroatom such as nitrogen, oxygen, sulfur, phosphorus, and arsenic. Such heteroatom-substituted aliphatic groups include, for example, thiophene, pyridine, pyrimidine, pyrrole, phosphole, arsole and furane.

It may also be desirable for some applications if the silsesquioxane units include units of the formula ($R^1SiO_{1.5}$) and ($R^2SiO_{1.5}$), wherein $R^1$ is a substituted or unsubstituted aliphatic group and $R^2$ is a substituted or unsubstituted aromatic group. The presence of both aliphatic and aromatic silsesquioxane units in the composition is believed to result in a polymer having properties which are more desirable for certain applications than those resulting from aliphatic-only or aromatic-only silsesquioxane units. For example, the presence of aliphatic groups is believed to provide for greater cross-linking density and/or enhanced dissolution in a developer solution, while aromatic groups are believed to result in a more tough, crack-resistant polymer.

It may be beneficial for some applications that in each of the silsesquioxane units of the polymer, R is free of hydroxy groups. It is believed that as a result of the hydroxy-free side chain groups, optical loss characteristics can be improved over materials using hydroxy-containing side chain groups. In this regard, hydroxy-containing side chain groups are believed to contribute to optical loss due to light absorption, for example, at 1550 nm which is a commonly used wavelength in the optoelectronics industry.

The polymer may take the form of a copolymer or higher order polymer, either random- or block-type. For example, the polymer may include one or more additional silicon-containing unit such as one or more additional unit chosen from silsesquioxanes, cage siloxanes, siloxanes and combinations thereof. For example, the polymer may include one or more additional unit of the formula ($R^3SiO_{1.5}$), wherein $R^3$ is a substituted or unsubstituted organic group and is free of hydroxy groups. The polymer may contain, for example, methyl, butyl and phenyl silsesquioxane units; ethyl, phenyl and trifluoromethylphenyl silsesquioxane units or methyl, benzyl and phenyl silsesquioxane units. Suitable siloxanes include, for example, units of the formula (($R^4$)$_2$SiO), wherein $R^4$ is a substituted or unsubstituted organic group, such as an alkyl group, for example, methyl, ethyl, propyl, and the like, or an aryl group, for example, phenyl, tolyl, and the like.

The polymers may contain a wide range of repeating units. Thus, the polymer may vary widely in molecular weight. Typically, the polymers have a weight average molecular weight ($M_w$) of from about 500 to 15,000, more typically from about 1000 to 10,000.

The polymers may include two or more functional end groups that allow a solubility change in the composition after photoactivation. Such end groups may be, for example, hydroxy; alkoxy such as ethoxy, propoxy, isopropoxy; carboxyester, amino, amido, epoxy, imino, carboxyacid, anhydride, olefinic, acrylic, acetal, orthoester, vinyl ether, and combinations thereof. The functional end content may be, for example, from about 0.5 to 35 wt % based on the polymer.

The compositions and resulting non-photoimageable, thermally curable polymeric layers include a component for effecting a cross-linking reaction in the polymer upon thermal activation. The thermally active component may, for example, generate an acid or base upon activation which causes cross-linking and thus curing of the polymer upon thermal activation. A wide variety of thermally active components may be used in the present invention, including, but not limited to, thermal acid generators and thermal base generators.

The thermal acid generators useful in the present invention are any compounds which liberate acid upon heating, typically at a temperature in the range of about 25° to 220° C. Suitable thermal acid generators useful in the present invention include, for example: 2,4,4,6-tetrabromocyclohexadienone; organic sulfonic acids, such as dinonylnaphthalene disulfonic acid, dinonylnaphthalene sulfonic acid, dodecylbenzene sulfonic acid and p-toluene sulfonic acid; alkyl esters of organic sulfonic acids, such as benzoin tosylate, and 2-nitrobenzyl tosylate; benzylic halogenated aromatic compounds; mono- and di-alkyl acid phosphates; mono- and di-phenyl acid phosphates; alkylphenyl acid phosphates, and combinations thereof. The thermal acid generator may be blocked, for example, blocked acid esters, such as blocked dodecyl sulfonic acid esters and blocked phosphonic acid esters. Thermal acid generators are commercially available, such as the NACURE brand of blocked acid generators available from King Industries, Norwalk, Conn.

The thermal base generators useful in the present invention are any compounds which liberate base upon heating, typically at a temperature in the range of about 25° to 220° C. Suitable thermal base generators useful in the present invention include, for example, those described in Japanese published Application No. 5-158242, the entire contents of which are herein incorporated by reference.

The amount of the thermally active component is any amount sufficient to effect cross-linking of the polymeric layer upon heating. The thermally active component is typically present in the composition in an amount of from 0.1 to 10 wt %, for example from 0.1 to 5 wt %.

One or more components for improving the flexibility of the structures formed from the composition may be present in the composition. These flexibility-improving materials typically contain a plurality of functional groups chosen from hydroxy, amino, thiol, sulphonate ester, carboxylate ester, silyl ester, anhydride, aziridine, methylolmethyl, silyl ether, epoxides, oxetanes, vinyl ethers, silanols and combinations thereof. In the flexibility-improving materials, the functional groups are typically attached to backbone materials. Exemplary backbone materials include substituted and unsubstituted alkyl and aryl hydrocarbons, ethers, acrylates, novolacs, polyimides, polyurethanes, polyesters, polysulfones, polyketones, fullerenes, POSS silicons, nanoparticles, and combinations thereof. The functional groups may be present as end groups on the backbone and/or at one or more locations along the backbone.

Examples of flexibilizing components are polyols of formula $R^5(OH)_x$ wherein $R^5$ is an organic group chosen from substituted or unsubstituted $(C_2-C_{25})$alkyl, $(C_7-C_{25})$aryl, $(C_8-C_{25})$aralkyl, $(C_6-C_{25})$cycloalkyl, and combinations thereof, wherein x is 2 or more and does not exceed the number of carbon atoms. When x is 2, examples of the flexibilizing component include glycols, which are 1,2 diols, such as $HOCH_2$—$CHOH$—$(CH_2)_y$—$CH_3$ wherein y may be, for example, from 0 to 22, such as propylene glycol and butylene glycol. Other examples include α,ω-diols such as $HO$—$(CH_2)_z$—$OH$ wherein z is, for example, from 2 to 25 such as ethylene glycol, 1,3-propanediol and 1,4-butanediol. When x is 3 examples include glycerin and trimethylolpropane.

$R^5$ may also be a polyether of formula —$O$—$(CR^6{}_2)_w$— wherein w is, for example, from 1 to 13 and $R^6$ is the same or different and may be, for example, H, or a substituted or unsubstituted organic group of formula $C_1-C_{12}$ alkyl, aryl, aralkyl or cycloalkyl. Examples of flexibilizing components include polyether diols of polyethylene oxide, polypropylene oxide, polybutylene oxide, and polytetrahydrofurane.

The flexibility-improving component may have a weight average molecular weight, for example, of from 62 to 5000, for example from 62 to 2000. This component may be present in an effective amount to improve the flexibility of the composition in a dried state before and after activation. The specific amount will depend, for example on the backbone and type of and number of functional groups of the flexibility-improving component. This component may, for example, be present in the composition in an amount of from 0.5 to 35 wt %, for example from 2 to 20 wt %.

In addition to the foregoing flexibilizers, the use of siloxanes such as those described above with reference to the polymer having units of the formula $((R^4)_2SiO)$ may be used.

Other additives may optionally be present in the compositions including, but are not limited to, surface leveling agents, wetting agents, antifoam agents, adhesion promoters, thixotropic agents, fillers, viscosity modifiers, and the like. Such additives are well known in the art of coating compositions. The use of surface leveling agents, for example silicone-base oils such as SILWET L-7604 silicone-base oil available from Dow Chemical Company, in the compositions may be used. It will be appreciated that more than one additive may be combined in the compositions of the present invention. For example, a wetting agent may be combined with a thixotropic agent. The amounts of such optional additives to be used in the present compositions will depend on the particular additive and desired effect, and are within the ability of those skilled in the art. Such other additives are typically present in the composition in an amount of less than 5 wt %, for example less than 2.5 wt %.

The compositions useful in the invention may optionally contain one or more cross-linking agents. Cross-linking agents include, for example, materials which link up components of the composition in a three-dimensional manner. Aromatic or aliphatic cross-linking agents that react with the silicon-containing polymer are suitable for use in the present invention. Such organic cross-linking agents will cure to form a polymerized network with the silicon-containing polymer. Such organic cross-linking agents may be monomers or polymers. It will be appreciated by those skilled in the art that combinations of cross-linking agents may be used successfully in the present invention.

Suitable organic cross-linking agents useful in the present invention include, but are not limited to, amine containing compounds, epoxy containing materials, compounds containing at least two vinyl ether groups, allyl substituted aromatic compounds, and combinations thereof. Typical cross-linking agents include amine containing compounds and epoxy containing materials.

The amine containing compounds useful as cross-linking agents in the present invention include, but are not limited to, melamine monomers, melamine polymers, alkylolmethyl melamines, benzoguanamine resins, benzoguanamine-formaldehyde resins, urea-formaldehyde resins, glycoluril-formaldehyde resins, and combinations thereof.

It will be appreciated by those skilled in the art that suitable organic cross-linker concentrations will vary with factors such as cross-linker reactivity and specific application of the composition. When used, the cross-linking agent (s) is typically present in the composition in an amount of from 0.1 to 50 wt %, for example, from 0.5 to 25 wt % or from 1 to 20 wt %.

One or more of the additives may serve to adjust the refractive index of the polymeric layer, for example, a clad layer in the case of an optical waveguide.

The composition typically further includes a solvent. A wide variety of solvents may be used, for example: glycol ethers, such as ethylene glycol monomethyl ether, propylene glycol monomethyl ether, and dipropylene glycol monomethyl ether; esters such as methyl cellosolve acetate, ethyl cellosolve acetate, propylene glycol monomethyl ether acetate, dipropylene glycol monomethyl ether acetate; dibasic esters; carbonates such as propylene carbonate; γ-butyrolactone; esters such as ethyl lactate, n-amyl acetate and n-butyl acetate; alcohols such as n-propanol, iso-propanol; ketones such as cyclohexanone, methyl isobutyl ketone, diisobutyl ketone and 2-heptanone; lactones such as γ-butyrolactone and γ-caprolactone; ethers such as diphenyl ether and anisole; hydrocarbons such as mesitylene, toluene and xylene; and heterocyclic compounds such as N-methyl-2-pyrrolidone, N,N'-dimethylpropyleneurea; and mixtures thereof.

Photoimageable polymeric layers and dry-films which include a such layers, useful in forming optical layers to be patterned, can be formed in the same manner described above with respect to the non-photoimageable compositions and dry-films, except a photoactive component such as a photoacid or photobase generator is used in place of the thermally active component. The photoacid generators may be any compound or compounds which generate acid upon exposure to light. Suitable photoacid generators are known and include, but are not limited to, halogenated triazines, onium salts, sulfonated esters, substituted hydroxyimides, substituted hydroxylimines, azides, naphthoquinones such as diazonaphthoquinones, diazo compounds, and combinations thereof.

Useful halogenated triazines include, for example, halogenated alkyl triazines such as the trihalomethyl-s-triazines. The s-triazine compounds are condensation reaction products of certain methyl-trihalomethyl-s-triazines and certain aldehydes or aldehyde derivatives. Such s-triazine compounds may be prepared according to the procedures disclosed in U.S. Pat. No. 3,954,475 and Wakabayashi et al., *Bulletin of the Chemical Society of Japan*, 42, 2924-30 (1969). Other triazine type photoacid generators useful in the present invention are disclosed, for example, in U.S. Pat. No. 5,366,846.

Onium salts with weakly nucleophilic anions are particularly suitable for use as photoacid generators. Examples of such anions are the halogen complex anions of divalent to heptavalent metals or non-metals, for example, antimony, tin, iron, bismuth, aluminum, gallium, indium, titanium, zirconium, scandium, chromium, hafnium, copper, boron, phosphorus and arsenic. Examples of suitable onium salts include, but are not limited to, diazonium salts such as diaryl-diazonium salts and onium salts of group VA and B, IIA and B and I of the Periodic Table, for example, halonium salts such as iodonium salts, quaternary ammonium, phosphonium and arsonium salts, sulfonium salts such as aromatic sulfonium salts, sulfoxonium salts or selenium salts. Examples of suitable onium salts are disclosed, for example, in U.S. Pat. Nos. 4,442,197; 4,603,101; and 4,624,912. Sulfonium salts such as triphenylsulfonium hexafluorophosphate and mixtures thereof are typical.

The sulfonated esters useful as photoacid generators include, for example, sulfonyloxy ketones. Suitable sulfonated esters include, but are not limited to, benzoin tosylate, t-butylphenyl alpha-(p-toluenesulfonyloxy)-acetate, 2,6-dinitrobenzyl tosylate, and t-butyl alpha-(p-toluenesulfonyloxy)-acetate. Such sulfonated esters are disclosed, for example, in the *Journal of Photopolymer Science and Technology*, vol. 4, No. 3,337-340 (1991).

Substituted hydroxyimides which may be used include, for example, n-trifluoromethylsulfonyloxy-2,3-diphenylmaleimide and 2-trifluoromethylbenzenesulfonyloxy-2,3-diphenylmaleimide. Suitable substituted hydroxylimines include, for example, 2-(-nitrilo-2-methylbenzylidene)-(5-hydroxyiminobutylsulfonyl)-thiophene. Azides include, for example, 2,6-(4-azidobenzylidene)cyclohexanone. Naphthoquinones may include, for example, 2,1-diazonaphthoquinone-4-sulfonate ester of 2,3,4-trihydroxybenzophenone. Among the diazo compounds, 1,7-bis(4-chlorosulonyl phenyl)-4-diazo-3,5-heptanedione may be used.

Photobase generators may be any compound or compounds which liberate base upon exposure to light. Suitable photobase generators include, but are not limited to, benzyl carbamates, benzoin carbamates, O-carbamoylhydroxyamines, O-carbamoyloximes, aromatic sulfonamides, alpha-lactams, N-(2-allylethenyl)amides, arylazide compounds, N-arylformamides, 4-(ortho-nitrophenyl)dihydropyridines, and combinations thereof.

The developer for the photoimageable polymeric layer may be an aqueous or non-aqueous developer solution, or a combination thereof, and may optionally include one or more additives, for example, antifoaming agents, surfactants and the like. Typical aqueous developers include, for example, alkali metal hydroxides such as sodium hydroxide and potassium hydroxide in water, as well as tetraalkylammonium hydroxide such as tetramethylammonium hydroxide, in water. Such developers are typically used in concentrations from 0.1 to 2N, for example, 0.15 to 1N, or 0.26 to 0.7N.

Typical non-aqueous developers include, for example, ketones such as acetone, methyl ethyl ketone, methyl isobutyl ketone, cyclohexanone, 2-octanone, 2-heptanone and methyl isoamyl ketone; alcohols such as ethanol, isopropanol, n-propanol, n-butanol, isobutanol and benzyl alcohol; esters such as ethyl acetate, ethyl propionate and ethyl lactate; glycol ethers such as ethylene glycol methyl ether, propylene glycol ethyl ether, propylene glycol methyl ether; glycol ether esters such as ethylene glycol monomethyl ether acetate and propylene glycol mono methyl ether acetate; aromatics such as toluene, xylene, chlorobenzene, dichlorobenzene and the like, and combinations thereof.

Development of the photoimageable polymeric layer is typically conducted at a temperature of from 20 to 85° C., for example from 21 to 49° C. Development time with aggressive agitation may be within ten minutes, for example, within five minutes, within two minutes, within one minute, or within 30 seconds. Development may take place, for example, in a static development chamber or in a spray chamber. Typical spray pressures range from 5 to 40 psi (0.35 to 2.8 kg/cm$^2$), for example, from 10 to 25 psi (0.7 to 1.8 kg/cm$^2$).

The following prophetic examples are intended to illustrate further various aspects of the present invention, but are not intended to limit the scope of the invention in any aspect. For purposes of the examples, amounts for the various components are given in weight % based on the entire composition including solvent.

1. Preparation of Non-Photoimageable, Thermally Curable Optical Dry-Films

EXAMPLES 1-6

The components set forth below are combined in admixture to form a composition for each Example. The composition is roller coated onto a 50 μm thick polyethylene terephthalate (PET) carrier substrate film to a wet thickness of 100 μm and is dried in a convection oven for 30 minutes at 90° C. to a thickness of 50 μm. A 25 μm thick polyethylene (PE) protective cover layer is applied to the surface of the coated layer with a roller to create a dry-film. The dry-film is wound into a roll configuration such as shown in FIG. 1C.

| | wt % |
|---|---|
| Example 1 (Examples 7, 13) | |
| propylene glycol monomethyl ether acetate | 45.00 |
| phenyl-methyl-trifluoromethylsilsesquioxane (47.5:47.5:5.0) | 52.99 |
| King Industries NACURE 5225 amine blocked dodecylsulfonic acid | 2.00 |
| Dow SILWET L-7604 silicone-base oil | 0.01 |
| Example 2 (Examples 8, 14) | |
| propylene glycol monomethyl ether acetate | 45.00 |
| phenyl-methyl-dimethylsilsesquioxane (47.5:47.5:5.0) | 52.99 |
| King Industries NACURE 1323 amine blocked dinonylnaphthalene disulfonic acid | 2.00 |
| Dow SIL WET L-7604 silicone-base oil | 0.01 |
| Example 3 (Examples 9, 15) | |
| propylene glycol monomethyl ether acetate | 45.00 |
| phenyl-methyl-dimethylsilsesquioxane (48:48:2) | 52.99 |
| King Industries NACURE XP-386 amine blocked para-toluene sulfonic acid | 2.00 |
| Dow SILWET L-7604 silicone-base oil | 0.01 |
| Example 4 (Examples 10, 16) | |
| propylene glycol monomethyl ether acetate | 45.00 |
| phenyl-methyl-dimethylsilsesquioxane (45:45:10) | 52.99 |
| King Industries NACURE 4167 amine blocked alkylphenyl acid phosphates | 2.00 |
| Dow SILWET L-7604 silicone-base oil | 0.01 |
| Example 5 (Examples 11, 17) | |
| propylene glycol monomethyl ether acetate | 45.00 |
| phenyl-methyl-benzylsilsesquioxane (48:48:2) | 42.99 |

-continued

| | wt % |
|---|---|
| polytetrahydrofurane | 10.00 |
| King Industries NACURE 4167 amine blocked alkylphenyl acid phosphates | 2.00 |
| Dow SILWET L-7604 silicone-base oil | 0.01 |

Example 6 (Examples 12, 18)

| | wt % |
|---|---|
| propylene glycol monomethyl ether acetate | 45.00 |
| phenyl-methyl-dimethylsilsesquioxane (42.5:42.5:15) | 52.99 |
| King Industries NACURE XP-297 amine blocked phosphonic acid ester | 2.00 |
| Dow SILWET L-7604 silicone-base oil | 0.01 |

EXAMPLES 7-12

The procedures and materials of Examples 1-6 are repeated, except prior to roller coating, the back surface of the PET substrate is coated with a 5 µm silicone release layer in place of the front surface PE protective cover layer.

EXAMPLES 13-18

The procedures and materials of Examples 1-6 are repeated, except the substrate is 125 µm thick Kraft paper impregnated with polyethylene on its back surface, in place of the front surface PE protective cover layer.

2. Preparation of Printed Wiring Boards

EXAMPLES 19-36 a. Bottom Clad Formation

A 30 mg/cm² copper foil clad printed wiring board containing circuitry thereon is placed in a hot roll laminator. The front surface PE protective cover layer (if present) is removed from the remainder of the bottom clad ("clad 1") dry-film specified in Table 1. The polymeric layer of the dry-film is placed against the copper surface on the printed wiring board, and the dry-film is laminated to the printed wiring board in the hot-roll laminator at 30 cm/min, 20 psi (1.4 kg/cm²), and 100° C. The PET film is removed from the structure, and the printed wiring board is placed in a convection oven at 180° C. for 60 minutes to thermally cure the layer, thus forming a bottom clad layer on the printed wiring board.

b. Core Structure Formation

Core compositions A-F are formed by combining in admixture the respective components described below. Each of the printed wiring boards laminated with the bottom clad layer is roller-coated with one of core compositions A-F as specified in Table 1, to a thickness of 50 µm and dried in air in a convection oven for 30 minutes at 90° C. The printed wiring board is annealed in air at a starting temperature of 90° C. ramped down to room temperature at a rate of two degrees per minute. The polymeric core layer is exposed to 500 mJ/cm² of actinic radiation from a mercury halide lamp through a mask containing core patterns including openings of from 2 to 30 cm with widths of from 25 to 250 µm. The printed wiring board is placed in a convection oven for 20 minutes at 90° C., and is placed in a 0.7 N NaOH developer solution for 2.5 minutes at room temperature with mild agitation. The printed wiring board is rinsed in DI water and dried with an air knife. It is then cured in a convection oven at 180° C. for 60 minutes, resulting in a plurality of waveguide cores on the waveguide bottom clad layer.

| | wt % |
|---|---|
| Core Composition A | |
| propylene glycol monomethyl ether acetate | 45 |
| phenyl-methyl-trifluoromethylsilsesquioxane (52.5:42.5:5.0) | 54.84 |
| triphenylsulfonium tosylate | 0.15 |
| Dow SILWET L-7604 silicone-base oil | 0.01 |
| Core Composition B | |
| propylene glycol monomethyl ether acetate | 45 |
| phenyl-methyl-dimethylsilsesquioxane (55.5:39.5:5.0) | 54.84 |
| triphenylsulfonium tosylate | 0.15 |
| Dow SILWET L-7604 silicone-base oil | 0.01 |
| Core Composition C | |
| propylene glycol monomethyl ether acetate | 45 |
| phenyl-methyl-dimethylsilsesquioxane (55:43:2) | 54.84 |
| triphenylsulfonium tosylate | 0.15 |
| Dow SILWET L-7604 silicone-base oil | 0.01 |
| Core Composition D | |
| propylene glycol monomethyl ether acetate | 45 |
| phenyl-methyl-dimethylsilsesquioxane (60:30:10) | 54.84 |
| triphenylsulfonium tosylate | 0.15 |
| Dow SILWET L-7604 silicone-base oil | 0.01 |
| Core Composition E | |
| propylene glycol monomethyl ether acetate | 45 |
| phenyl-methyl-benzylsilsesquioxane (48:48:2) | 44.84 |
| polytetrahydrofurane | 10 |
| triphenylsulfonium tosylate | 0.15 |
| Dow SILWET L-7604 silicone-base oil | 0.01 |
| Core Composition F | |
| propylene glycol monomethyl ether acetate | 45 |
| phenyl-methyl-dimethylsilsesquioxane (52.5:32.5:15) | 54.84 |
| triphenylsulfonium tosylate | 0.15 |
| Dow SILWET L-7604 silicone-base oil | 0.01 | c. Top Clad Formation

The same procedures described above for the bottom clad layer are used to form a top clad ("Clad 2") layer over the bottom clad layer and core structures, as shown in Table 1. A waveguide structure is thereby formed on the printed wiring board substrate.

TABLE 1

| Ex. | Layer | Material |
|---|---|---|
| 19 | Clad 1 | Ex. 1 |
| | Core | Comp. A |
| | Clad 2 | Ex. 1 |
| 20 | Clad 1 | Ex. 2 |
| | Core | Comp. B |
| | Clad 2 | Ex. 2 |
| 21 | Clad 1 | Ex. 3 |
| | Core | Comp. C |
| | Clad 2 | Ex. 3 |
| 22 | Clad 1 | Ex. 4 |
| | Core | Comp. D |
| | Clad 2 | Ex. 4 |
| 23 | Clad 1 | Ex. 5 |
| | Core | Comp. E |
| | Clad 2 | Ex. 5 |
| 24 | Clad 1 | Ex. 6 |
| | Core | Comp. F |
| | Clad 2 | Ex. 6 |
| 25 | Clad 1 | Ex. 7 |
| | Core | Comp. A |
| | Clad 2 | Ex. 7 |
| 26 | Clad 1 | Ex. 8 |
| | Core | Comp. B |
| | Clad 2 | Ex. 8 |
| 27 | Clad 1 | Ex. 9 |

TABLE 1-continued

| Ex. | Layer | Material |
|---|---|---|
|  | Core | Comp. C |
|  | Clad 2 | Ex. 9 |
| 28 | Clad 1 | Ex. 10 |
|  | Core | Comp. D |
|  | Clad 2 | Ex. 10 |
| 29 | Clad 1 | Ex. 11 |
|  | Core | Comp. E |
|  | Clad 2 | Ex. 11 |
| 30 | Clad 1 | Ex. 12 |
|  | Core | Comp. F |
|  | Clad 2 | Ex. 12 |
| 31 | Clad 1 | Ex. 13 |
|  | Core | Comp. A |
|  | Clad 2 | Ex. 13 |
| 32 | Clad 1 | Ex. 14 |
|  | Core | Comp. B |
|  | Clad 2 | Ex. 14 |
| 33 | Clad 1 | Ex. 15 |
|  | Core | Comp. C |
|  | Clad 2 | Ex. 15 |
| 34 | Clad 1 | Ex. 16 |
|  | Core | Comp. D |
|  | Clad 2 | Ex. 16 |
| 35 | Clad 1 | Ex. 17 |
|  | Core | Comp. E |
|  | Clad 2 | Ex. 17 |
| 36 | Clad 1 | Ex. 18 |
|  | Core | Comp. F |
|  | Clad 2 | Ex. 18 |

While the invention has been described in detail with reference to specific embodiments thereof, it will be apparent to one skilled in the art that various changes and modifications can be made, and equivalents employed, without departing from the scope of the claims.

What is claimed is:

1. A dry-film suitable for use in forming an optical component, comprising:
    a carrier substrate having a front surface and a back surface;
    a non-photoimageable, thermally curable polymeric layer over the front surface of the carrier substrate, comprising a thermally active component and units of the formula ($RSiO_{1.5}$), wherein R is a substituted or unsubstituted organic group; and
    a protective cover layer over the front or back surface of the carrier substrate.

2. The dry-film of claim 1, wherein the thermally active component is a thermal acid generator.

3. The dry-film of claim 2, wherein the thermal acid generator is a blocked acid ester.

4. The dry-film of claim 1, wherein the carrier substrate is a polymeric film.

5. The dry-film of claim 1, wherein the dry-film is in a rolled configuration.

6. The dry-film of claim 5, wherein the protective cover layer is disposed over the back surface of the carrier substrate.

7. A method of forming an optical device, comprising:
    (a) applying over a first substrate a dry-film comprising a carrier substrate and a non-photoimageable, thermally curable polymeric layer, the polymeric layer comprising a thermally active component and units of the formula ($RSiO_{1.5}$), wherein R is a substituted or unsubstituted organic group; and
    (b) after (a), heat-curing at least a portion of the polymeric layer.

8. The method of claim 7, wherein the thermally active component is a thermal acid generator.

9. The method of claim 7, wherein the optical device is an optical waveguide comprising a core and a clad, wherein the clad comprises the heat-cured polymeric layer.

10. The method of claim 9, wherein the polymeric layer forms a bottom clad layer of the optical waveguide, and the core is disposed over the bottom clad layer, the method further comprising applying over the bottom clad layer and core a second dry-film comprising a carrier substrate and a non-photoimageable, thermally curable polymeric layer, the polymeric layer comprising a thermally active component and units of the formula ($R^1SiO_{1.5}$), wherein $R^1$ is a substituted or unsubstituted organic group and is the same as or different from R.

11. The method of claim 7, wherein the first substrate is a printed wiring board substrate.

* * * * *